(12) United States Patent
Freywald et al.

(10) Patent No.: US 8,742,536 B2
(45) Date of Patent: Jun. 3, 2014

(54) SOI DISKS COMPRISING MEMS STRUCTURES AND FILLED ISOLATING TRENCHES HAVING A DEFINED CROSS-SECTION

(75) Inventors: Karlheinz Freywald, Erfurt (DE); Gisbert Hoelzer, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 0 days.

(21) Appl. No.: 11/568,827

(22) PCT Filed: May 6, 2005

(86) PCT No.: PCT/DE2005/000855
§ 371 (c)(1),
(2), (4) Date: Sep. 24, 2007

(87) PCT Pub. No.: WO2005/112109
PCT Pub. Date: Nov. 24, 2005

(65) Prior Publication Data
US 2008/0042224 A1 Feb. 21, 2008

(30) Foreign Application Priority Data
May 8, 2004 (DE) .......................... 10 2004 022 781

(51) Int. Cl.
*H01L 21/76* (2006.01)

(52) U.S. Cl.
USPC .............. 257/510; 257/E29.02; 257/E21.548; 438/424

(58) Field of Classification Search
USPC ......... 257/347, 350, 354, 417, 418, 420, 507, 257/510, 516, 522, 619, E27.006, E29.167, 257/E29.324, 548, 549, 520, 553, 555, 513, 257/396, 397, E21.546, 505, 506, E29.02, 257/E21.545, E21.548, E21.549, E21.555; 438/424, 50, 51, 52, 53, 422
See application file for complete search history.

(56) References Cited

U.S. PATENT DOCUMENTS

| | | | |
|---|---|---|---|
| 4,533,430 A | 8/1985 | Bower et al. | |
| 5,448,102 A | 9/1995 | Gaul et al. | |
| 5,592,015 A | 1/1997 | Iida et al. | |
| 5,859,459 A * | 1/1999 | Ikeda | 257/374 |
| 6,117,701 A | 9/2000 | Buchan et al. | |
| 6,121,552 A * | 9/2000 | Brosnihan et al. | 174/253 |
| 6,229,194 B1 | 5/2001 | Lizotte | |
| 6,239,473 B1 | 5/2001 | Adams et al. | |

(Continued)

FOREIGN PATENT DOCUMENTS

| | | |
|---|---|---|
| DE | 197 51 740 | 6/1999 |
| DE | 101 37 370 | 1/2003 |

(Continued)

*Primary Examiner* — Tom Thomas
*Assistant Examiner* — Christopher M Roland
(74) *Attorney, Agent, or Firm* — Hunton & Williams LLP

(57) ABSTRACT

Forming of filled isolation trenches, in particular the transition area in trenches and recesses free of silicon during the realization of MEMS structures of SOI wafers. A reliable dielectric insulation of adjacent silicon regions is to be obtained. The insulation is achieved by filled isolation trenches. The end portions of the trench fill that are freed from the surrounding silicon by etching are free of conductive not completely removed silicon strips in the recess including the active sensor structure. This is accomplished by slanted wall of isolation trenches. Additionally, the trench fill should be removable at the transition area in an efficient manner. The technological realization does not require specific additional process steps.

7 Claims, 3 Drawing Sheets

(56) References Cited

U.S. PATENT DOCUMENTS

| | | | |
|---|---|---|---|
| 6,291,875 B1* | 9/2001 | Clark et al. | 257/622 |
| 6,380,037 B1 | 4/2002 | Osanai | |
| 6,433,401 B1* | 8/2002 | Clark et al. | 257/524 |
| 6,593,163 B1* | 7/2003 | Bonin et al. | 438/50 |
| 2003/0015764 A1 | 1/2003 | Raaijmakers et al. | |
| 2004/0147093 A1* | 7/2004 | Marty et al. | 438/442 |
| 2011/0012236 A1* | 1/2011 | Freywald et al. | 257/618 |

FOREIGN PATENT DOCUMENTS

| | | |
|---|---|---|
| DE | 103 37 370 | 1/2003 |
| EP | 1 391 936 | 2/2004 |
| JP | 04151850 A * | 5/1992 |
| WO | WO 02/103772 | 12/2002 |

* cited by examiner

Schematic
Section at position
A --- A

SOI DISKS COMPRISING MEMS STRUCTURES AND FILLED ISOLATING TRENCHES HAVING A DEFINED CROSS-SECTION

The invention relates to an isolation trench structure and a manufacturing technique for filled isolation trench structures used to dielectrically insulate regions of the active silicon layer of SOI wafers (silicon on insulator wafer) including MEMS structures and circuit units, wherein the filled isolation trench structures are at least partially formed at and/or within the recess or trench including the active sensor structure.

A vast field of applications of filled isolation trenches is the dielectric insulation of CMOS circuits based on SOI wafers. Patent document U.S. Pat. No. 6,229,194 discloses an application of this type. Since in this case MEMS elements having a recess including an active sensor structure are not to be realised, for a dielectric insulation the filled isolation trenches may be arranged as closed polygons such that the filled isolation trenches may not terminate in silicon-free regions, i.e., in recesses.

Moreover, in conventional techniques filled isolation trenches for integrated circuits are realised in single crystalline silicon (cf. 2003 001 5764 A1), wherein these trenches may be used for isolating diffusion regions in an area-efficient manner. In this case it may not necessarily be required to realise a closed polygon, since a total dielectric insulation can not be achieved.

Document U.S. Pat. No. 5,448,102 describes a method for reducing stress related to filled isolation trenches, which is applied to single-crystalline Si wafers and SOI wafers. In this technique only isolation trenches having a shape of a closed polygon are used. Isolation trenches terminating in a recess or trench, as is frequently used in SOI semiconductor structures including MEMS structures, are, similar to the previous documents, also not described in this document.

In various MEMS techniques based on SOI wafers the recess or the trench including the active sensor structure is formed together with the isolation trenches in a single common etch step, as is described in U.S. Pat. No. 6,117,701. In this case filling the trench is not feasible, since then the sensor structure would also be filled.

It is an object of the present invention to provide a technique, in which filled isolation structures for insulating semiconductor regions may be realised, which have a sufficiently high insulating strength, when the isolation structures terminate in recesses or run through the recesses in which sensor structures are to be provided.

According to the present invention in one aspect the object is solved by an SOI semiconductor structure having a first region and a second region and an isolation structure that is formed between the first and second regions as an isolation trench for electrically insulating the first region and the second region.

The invention thus contemplates the design of filled isolation trenches, wherein the inventive SOI semiconductor structure may act as a basis so as to particularly insulate transition areas in silicon-free areas (trenches or recesses) during the formation of MEMS structures in combination with circuit units on SOI wafers in a sufficient manner such that the isolation structure in the trench or recess, in which the sensor structure is to be formed, is present therein or terminates therein or runs through this recess. The isolation structure is responsible for dielectrically insulating adjacent silicon regions of such a MEMS structure. In this case the filled isolation structure ending in a recess to be formed represents a specialty. Within the recess or the trench receiving the sensor structure the isolation structure is etched along a corresponding short portion so as to be separated from the surrounding silicon. In order to achieve a high degree of insulation it is important to remove the surrounding silicon as completely as possible so as to avoid a possible conductive connection in the form of not entirely removed conductive silicon regions, in particular in the form of thin strips.

This objective is achieved by the design of the isolation structure of the present invention. In this way a (substantially) complete insulation of adjacent silicon regions may be obtained in the lateral direction by appropriately designing the isolation structures or at least the end portions thereof when realising MEMS structures on SOI wafers in combination with circuit structures.

Thus, the inventive SOI semiconductor structure allows complete exposure of the isolation structure at the transition area to the recess or trench contrary to the case when conventional techniques are used for forming isolation trenches. In conventional isolation trenches there is a disadvantage in that in the bottom area of the exposed trench filling or isolation structure a more or less wide conductive silicon strip may remain at sidewalls such that a conductive connection may hardly be avoided between adjacent silicon regions to be insulated from each other.

The SOI semiconductor structure according to the present invention has the advantage that it may be used for the manufacturing of MEMS structures without requiring the implementation of further process steps for manufacturing the device. The specific geometry of the isolation structure obtained by a respective recipe during the silicon etch process improves the etch behaviour in a subsequent silicon etch process in which a recess is to be formed in the silicon layer, wherein at least a portion of the isolation structure is involved in the etch process and also provides an enhanced etch behaviour at the bottom portion of the isolation structure due to the geometry that widens towards the bottom portion so that the silicon may substantially completely be removed. That is, due to the shape that widens in the downward direction and therefore may be referred to as A shape, the presence of undesired conductive silicon strips may substantially be avoided, since the slope of the sidewalls of the isolation structure enhances the etch attack at the sidewall, when the silicon is etched selectively with respect to the isolation structure during the manufacturing of the trench or recess.

In a further embodiment the isolation structure terminates in the recess, extends into the recess or extends through the recess. Due to the geometry of the isolation structure of the present invention any desired arrangement of the isolation structure within the recess formed may be realised, without compromising the insulation strength that may be caused by silicon residuals.

In a further embodiment the isolation structure downwardly broadens in a continuous manner. The continuous broadening of the width of the isolation structure may be achieved by appropriate etch techniques during the formation of a respective trench in the active silicon layer.

In a further advantageous embodiment the isolation structure is filled with a dielectric material in such a way that at least in portions of the isolation structure a void or cavity is provided in the interior of the isolation structure. This formation of a cavity that may result in a reduction of mechanical stress within the trench structure may particularly important in MEMS applications, so that in total an enhanced device performance may be achieved. The creation of cavities within the isolation structure may be achieved in a particularly advantageous manner due to the geometry of the inventive isolation structure by well-established deposition techniques, such as plasma assisted CVD (chemical vapour deposition), since the trench width broadening in the downward direction causes an early closing of the trench opening during deposition and hence promotes the creation of a respective void or cavity.

In a further advantageous embodiment a part of defined length of the isolation structure extends into the recess, wherein the part of the isolation structure extends in a linear manner or forms a corner or extends in a meander-like shape within the recess. In this way nearly any geometric configuration of the isolation structure may be realised within the recesses or trenches that are intended to receive active sensor elements, while not compromising the insulating characteristics.

In a further advantageous embodiment the isolation structure is substantially completely comprised of silicon dioxide except for cavities that may be formed. The highly superior characteristics of silicon dioxide in combination with silicon, i.e., for instance the pronounced etch selectivity of these two materials with respect to well-established etch recipes, the increased thermal stability of the interface between silicon and silicon dioxide, and the like, allow the production of highly reliable isolation structures in SOI MEMS structures.

In a further advantageous embodiment the isolation structure is provided with the geometry that broadens in the downward direction at the recess in which silicon is etched away. In this manner conventional isolation trench techniques may be used in portions of the active silicon layer that are not positioned in the vicinity of the recess, without compromising, however, the insulation characteristics in the recess.

According to another aspect of the present invention the above object is solved by a method for etching a recess into an active silicon layer of an SOI substrate. The method comprises the steps of providing an isolation trench in the active silicon layer, which extends to a buried insulating layer and which broadens downwardly at least in a portion corresponding to the recess. Moreover, the method comprises the step of selectively anisotropically etching the silicon to the buried insulating layer so as to form the recess.

As described above, a superior etch performance may be achieved when the etch front reaches the buried insulating layer due to the trench geometry of the present invention, so that the silicon may reliably be etched also at the bottom of the isolation structure, thereby avoiding respective silicon residuals as are typically created in conventional techniques.

In a further advantageous embodiment providing the isolation trench comprises etching a trench in the active silicon layer including sidewalls at least sections of which extend obliquely at least at the recess to be formed, and providing the isolation trench further comprises filling the trench with a dielectric material. Due to the trench geometry a superior fill behaviour caused by the reduction of loading effects during the deposition of the dielectric material by plasma assisted deposition techniques.

Furthermore,—in combination with the reliably formed sidewalls of the isolation structure extending down to the bottom—the oblique configuration provides for a reliable silicon removal during the entire etch process for forming the trench including the active sensor structure so that the silicon is removed with high reliability in particular the bottom of the isolation structure.

Preferably, a cavity is created during the deposition process at least the locations having the downwardly increasing width.

In further advantageous embodiments the present invention relates to SOI wafers comprising MEMS structures, circuit units and filled isolation trenches for the dielectric insulation of circuit portions having a different potential, wherein the isolation trenches terminate in, extend into or traverse the trenches or regions with removed silicon, where the sensor structures are located. The SOI wafers are characterised in that the sidewall of the filled isolation trenches are oblique such that the isolation trench continuously broadens in the downward direction, that is, it has an A shape.

In a further advantageous embodiment the filled isolation trench abuts with a defined long part in the trench to be etched and including the active sensor structure, so that the etch removal of the trench fill occurs from both longitudinal sides of the trench fill as well as from the front side.

In a further embodiment a short part of the filled trench extends in a linear through the trench to be etched including the active sensor structure, thereby enabling the etch-exposing of the trench fill from two sides, and the filled isolation trench does not terminate in the non-removed silicon region.

In a further embodiment a defined part of the isolation trench comprises a kink or extends in a meander-like manner through the trench or recess to be etched and including the active sensor structure, so that the exposing of the trench fill by etching occurs at two sides or at one or more corners.

In a further embodiment the isolation trenches are filled with silicon dioxide only, thereby allowing a complete removal of the trench fill at defined areas without risking an electric short.

In still a further embodiment the isolation trenches have an A-shaped cross section only at those portions that are relevant for the areas of the recesses or trenches having the silicon removed by etching.

Further advantageous embodiments are contained in the description of examples when referring to the accompanying drawings in order to explain and complete the claimed invention.

Figure 1:
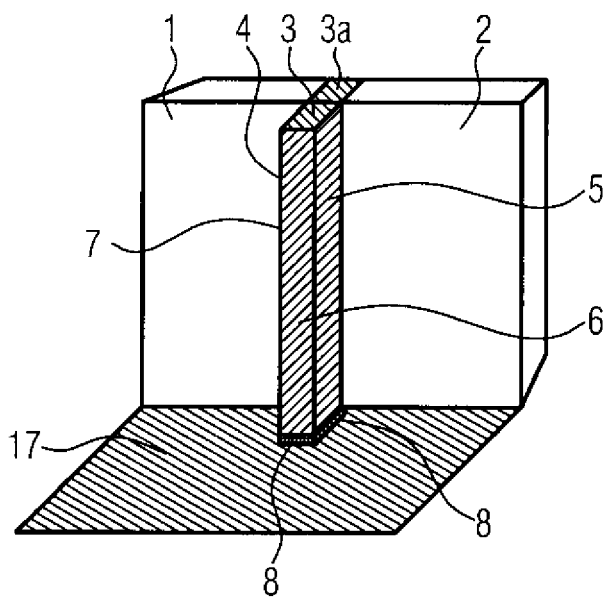
FIG. 1 is a schematic illustration of the end of a filled conventional isolation trench, wherein the surrounding silicon is incompletely removed at a short part of the filled isolation trench.

With reference to FIG. 1 first an SOI MEMS structure is shown that is formed according to a conventional technique.

FIG. 1 depicts a conventional technique in order to demonstrate the disadvantages that are overcome by the present invention. In FIG. 1 an exposed end 3 of the fill of a conventional trench 3a is shown such that a short part continuing the filled isolation trench 3a protrudes into a trench or recess 17 including an active sensor structure (not shown) in which the silicon is removed. The short part or the end 3 of the isolation trench 3a or the isolation structure has sidewalls 5, 6 and 7 that are formed in a substantially perpendicular manner, as is indicated by reference sign 4. The sidewalls 5, 6 and 7 are substantially completely free of silicon, whereas conductive silicon residuals or strips 8 may remain at the bottom area of the end 3 near the bottom and may abut the buried oxide, thereby possibly forming an electrically conductive connection between adjacent silicon regions 1 and 2 which are to be insulated.

Typically, the structure as shown in FIG. 1 is formed by first etching a trench between the regions 1 and 2 and subsequently filling the trench with an appropriate dielectric material, such as silicon dioxide. In this case loading effects may cause disturbances in particular near the bottom particularly during the filling of the trench, which is typically accomplished by plasma enhanced chemical vapour deposition. Furthermore, during the subsequent etch process for forming the recess 17 a complete removal of the silicon in the vicinity of the bottom is hindered owing to the substantially vertical walls 4 and due to loading effects during the plasma etch process so that the conductive silicon strips 8 are left.

Figure 2:
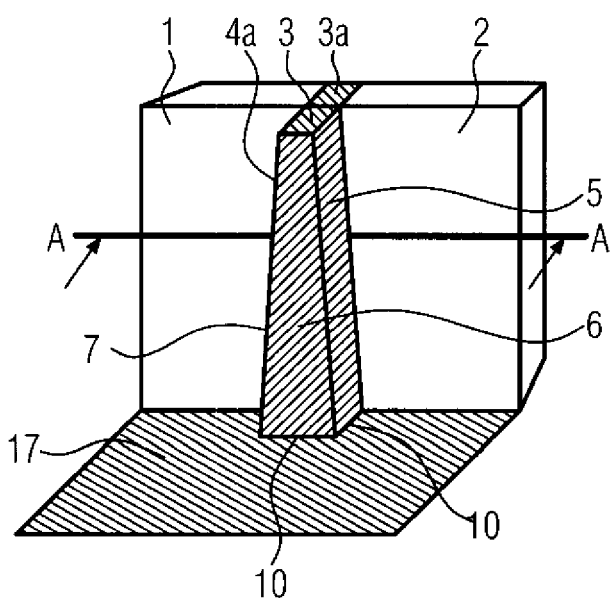
FIG. 2 is a schematic illustration of the end of a filled isolation trench according to the present invention, wherein the surrounding silicon is completely removed at a short part of the filled isolation trench.

FIG. 2 shows a corresponding SOI semiconductor structure according to the present invention, wherein a first region 1 is electrically isolated from a second region 2 by an isolation structure 3a that is provided as an isolation trench. Moreover, the isolation structure 3a comprises an exposed or isolated protrusion 3, which is thus exposed by etching from the surrounding silicon. The protrusion or part 3 of the isolation structure 3a extending into the recess 17 has sidewalls 5, 6 and 7, wherein in particular the sidewalls 5 and 7 are oblique, as indicated by reference numeral 4a, in such a way that at least the part 3 broadens in the downward direction. Furthermore, FIG. 2 shows that respective inner edges or corners 10 are substantially free of silicon and thus do not include undesired conductive silicon strips. FIG. 2 therefore demonstrates that by means of the inventive geometry, i.e., the A shape of the trench cross section at least at the part 3, the surrounding silicon may completely be removed from the sidewalls 5, 6 and 7. The walls of the filled isolation trench 3a and of the end 3 are not vertical (4a) in this embodiment. Therefore a complete exposure by etching is achieved in the area of the edge 10 so that a dielectric insulation of the adjacent silicon regions 1 and 2 is ensured.

The SOI semiconductor structure shown in FIG. 2 may be formed by performing an appropriate selective etch process for creating a trench between the regions 1 and 2, wherein for example, a respective small-sized etch mask may be used and wherein during the etch process the degree of anisotropy, for instance by controlling the bias between the plasma and the substrate, may be adjusted in a suitable manner so that an increasing degree of "isotropy" is achieved, which may result in a geometry of the trench that broadens in the downward direction. Thereafter, the resulting trench may be filled with silicon dioxide by well-established deposition techniques, such as plasma enhanced chemical vapour deposition, wherein respective cavities may be formed, as is described below, to form the isolation structure 3a. Subsequently, the recess 17 is formed by a corresponding anisotropic selective etch process, wherein due to the inventive geometry of the isolation trench 3a or at least of the part 3 a respective complete removal of the silicon at the edges 10 may be achieved.

Figure 3:
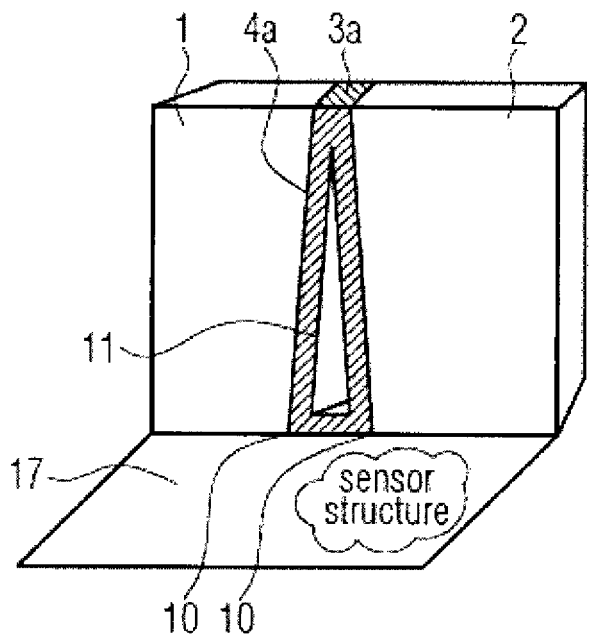
FIG. 3 is a schematic cross sectional view along the depth of the filled isolation trench at the boundary to the recess in the silicon according to FIG. 2.

FIG. 3 is a cross section of the isolation structure 3a at the boundary to the trench or recess 17 along the section A-A of FIG. 2. The adjacent silicon regions 1 and 2 are dielectrically insulated from each other. The isolation structure 3a comprises a remaining cavity or void 11 that is hermetically sealed in the upward direction. Due to the oblique sidewalls of the isolation structure 3a, as indicated by 4a, undesired conductive silicon strips may not remain at the inner edges/corners 10. Moreover, the cavity 11 may absorb respective inner mechanical stresses such that the active sensor structures formed in the recess 17 may exhibit a superior device performance.

Figure 4:
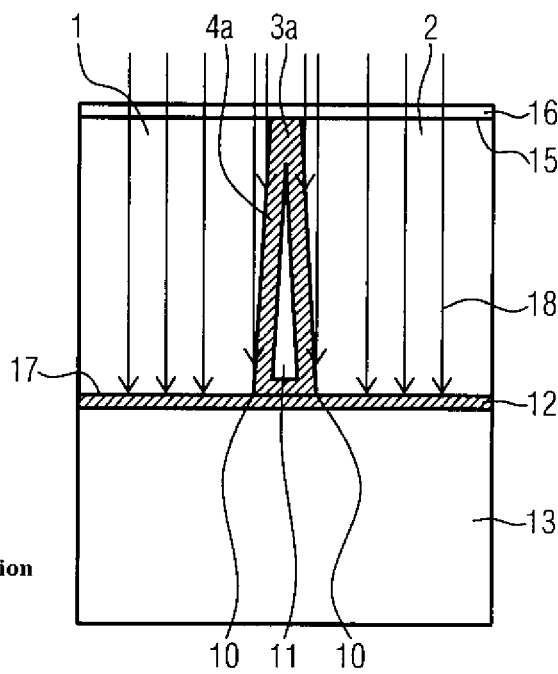
FIG. 4 is a schematic cross sectional view of the filled isolation trench along the same section as in FIG. 3 at a portion that extends into the recess including the active sensor structure.

FIG. 4 is a cross section taken along the end 3 of the isolation structure 3a that remains after the etch process and extends into the recess or trench 17 including the sensor structure, wherein the section is taken along the line A.A of FIG. 2. Arrows 18 represent an anisotropic etch process for exposing the short part 3 of the filled isolation trench by etching the surrounding silicon. The adjacent silicon regions 1 and 2 are electrically insulated. The isolation structure 3a comprises a remaining cavity 11 that is hermitically sealed in the upward direction. Due to the oblique sidewalls 4a of the end 3 of the isolation structure 3 no silicon residuals may remain after the etch process and the area of the inner edge/corner is obtained without undesired conductive silicon strips. During the etch process represented by the arrows 18 a respective portion of the SOI substrate is exposed and covered, respectively, by an etch mask 16 so that the recess 17 may be formed at the intended areas. The anisotropic etch process 18 starting at the silicon surface 15 removes the silicon in the downward direction shown by the arrow, wherein the portions not to be etched are protected by the etch mask 16. Due to the slope of the sidewalls 4a a continuous etch attack with respect to the sidewalls of the isolation structure 3a may take place during the progression of the etch process 18 such that a complete removal of the silicon covering the sidewalls of the isolation structure 3a may be accomplished. In this way the surrounding silicon is reliably removed and non-desired conductive silicon strips do substantially not remain at certain areas, as would be the case without oblique sidewalls causing no or a delayed removal particularly at the end of the etch process shortly before reaching the buried oxide 12. The recess or trench exposing by etching and including the active sensor structure terminates in the vertical direction on the buried oxide 12. Underneath is the substrate 13.

Figure 5:
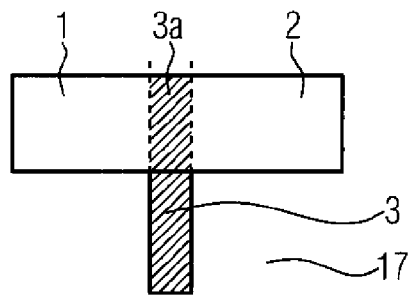
FIG. 5 is a schematic illustration of a portion of the layout, wherein the filled isolation trench terminates in the recess or trench including the active sensor structure.

FIG. 5 schematically illustrates a view of a geometric arrangement of the isolation structure 3a having a respective end portion 3 that terminates in the recess 17 in a linear manner, wherein the isolation structure 3a electrically insulates respective silicon regions 1 and 2 from each other.

Figure 6:
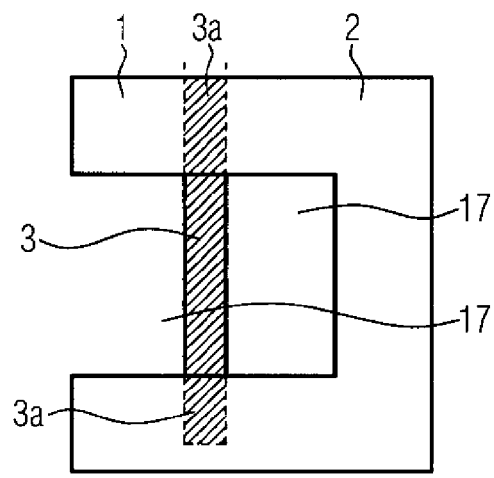
FIG. 6 is a schematic view of a portion of the layout, wherein the fill of the isolation trench continues in the trench or recess including the active sensor structure and exposed by etching, and wherein the fill extends through the recess or trench in a linear manner and terminates in a silicon region.

FIG. 6 depicts a respective configuration, in which the isolation structure 3a traverses the respective recess 17 in a substantially linear manner so as to terminate in the active silicon layer that also carries the regions 1 and 2.

Figure 7:
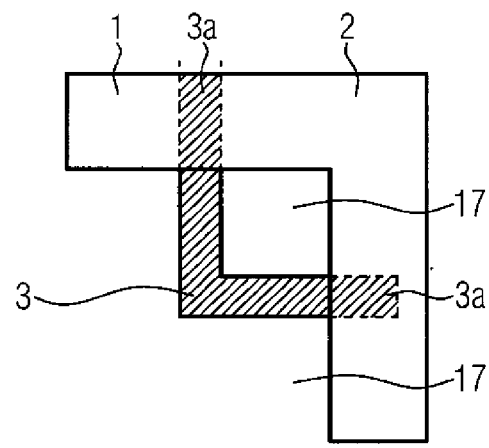
FIG. 7 is a schematic view of a portion of the layout, wherein the fill of the isolation trench extends through the trench or recess including the active sensor structure in the form of a trench fill exposed by removing the surrounding silicon along an angled path (in the example shown along a rectangular path) and terminates in a silicon region.

FIG. 7 shows a respective arrangement, in which the isolation structure 3 is disposed in a rectangular manner within the recess 17 and terminates in the active silicon layer in the corresponding isolation structure 3a and thus electrically isolates the respective regions 1 and 2 from each other.

A creation of filled isolation trenches, in particular the transition area in regions that are free from silicon (e.g. trenches and recesses), is accomplished during the realisation of MEMS structures on SOI wafers, thereby ensuring a reliable dielectric insulation of adjacent silicon regions. The insulation is achieved by filled isolation trenches. For this purpose, it is important that the bottom areas of the trench fill that are freed from the surrounding silicon by etching are free from conductive and not completely removed silicon strips within the trench including the active sensor structure. This is accomplished by slant, that is, oblique walls of the isolation trenches so that the isolation trench broadens towards its bottom area. Additionally, the trench fill may again readily be removed in the transition area. The technological realisation does not require additional process steps.

We claim:

1. An SOI semiconductor structure comprising
   a first region and a second region isolated from the first region by an isolated trench;
   a recess having a bottom of a buried oxide, said recess terminating in a vertical direction on the buried oxide, said recess provided for receiving a sensor structure;
   wherein the isolation trench has a width, a length, a depth, and a continuation, the isolation trench extending vertically between the first region and the second region and electrically insulating the first region from the second region along the length and depth of the isolation trench, and the continuation extending into the recess and standing free from the first and second regions;
   wherein the isolation trench and the continuation thereof continuously broaden in a downward direction from a top of the isolation trench and its continuation to the buried oxide.

2. The SOI semiconductor structure of claim 1, wherein the isolation trench is filled with a dielectric material and a cavity in at least a portion of an interior of the isolation trench is formed.

3. The SOI semiconductor structure of claim 1, wherein the continuation of the isolation trench extends through the recess in a linear manner.

4. The SOI semiconductor structure of claim 1, wherein the continuation of the isolation trench extends through the recess in one of an angled manner and a meander manner.

5. The SOI semiconductor structure of claim 1, wherein the isolation trench comprises silicon dioxide.

6. The SOI semiconductor structure of claim 1, wherein the continuation of the isolation trench traverses the recess.

7. An SOI semiconductor structure comprising
   a first silicon region and a second silicon region;
   a recess having a bottom of a buried oxide, terminating said recess in a vertical direction, and for receiving a sensor structure;
   an isolation trench, extending between the first and the second regions, wherein the isolation trench continuously broadens in a downward direction and down to the buried oxide, and electrically insulating both regions
   wherein the isolation trench has a continuation that extends into the recess and both the trench and the continuation thereof continuously broaden in the downward direction from a top of the isolation trench and its continuation to the bottom of the recess and the isolation trench and its continuation are formed on the buried oxide.

* * * * *